United States Patent [19]

Fu

[11] Patent Number: 5,908,662

[45] Date of Patent: Jun. 1, 1999

[54] METHOD AND APPARATUS FOR REDUCING PARTICLE CONTAMINATION

[75] Inventor: Thomas Tong-Hong Fu, Plano, Tex.

[73] Assignee: Texas Instruments Incorporated, Dallas, Tex.

[21] Appl. No.: 08/097,588

[22] Filed: Jul. 26, 1993

Related U.S. Application Data

[63] Continuation of application No. 07/874,668, Apr. 27, 1992, abandoned.

[51] Int. Cl.$^6$ ..................................................... C23C 16/00
[52] U.S. Cl. ......................................... 427/248.1; 118/715
[58] Field of Search .......................... 427/248.1; 118/715

[56] References Cited

U.S. PATENT DOCUMENTS 5,002,793  3/1991  Arai ......................................... 427/575
5,123,375  6/1992  Hansen .................................... 118/715

*Primary Examiner*—Shrive Beck
*Assistant Examiner*—David M. Maiorana
*Attorney, Agent, or Firm*—Robby T. Holland; Carlton H. Hoel; Richard L. Donaldson

[57] ABSTRACT

A processing system including a vacuum chamber 24 and at least one tube 12 disposed through a wall 14 of the vacuum chamber 24 is described herein. A gas diffuser 22 is disposed in said tube 12, possibly at the end of the tube 12 and/or outside the chamber 24. The gas diffuser 22 is formed from a porous, possibly metallic, material which includes a plurality of microscopic holes whereby gas entering or leaving the vacuum chamber through the tube has a reduced force compared to if the gas diffuser 22 was not present. Other systems and methods are also disclosed.

19 Claims, 6 Drawing Sheets

METHOD AND APPARATUS FOR REDUCING PARTICLE CONTAMINATION

This application is a continuation of application Ser. No. 07/874,668, filed Apr. 27, 1992, now abandoned.

This invention was made with government support under contract no. F33615-88-C-5448 awarded by the United States Air Force. The government may have certain rights in this invention.

FIELD OF THE INVENTION

This invention generally relates to the fabrication of semiconductor devices and more specifically to a method and apparatus for reducing particle contamination in vacuum process equipment.

BACKGROUND OF THE INVENTION

In the fabrication of integrated circuits, an ongoing goal is to produce devices which are increasingly smaller. Currently, it is common to fabricate devices which have elements which are only a fraction of a micron in size.

One of the problems which limit fabrication processes and severely hinder yields is due to contamination. Unwanted particles can contaminate wafers in many ways including through human contact, unpure processing chemicals and through the process equipment. These unwanted contaminants may become embedded in the wafer and create unwanted electrical characteristics or may interfere with the photolithographic masking steps thereby reducing production yields.

Steps are presently being taken to reduce to number of particles which may contaminate a semiconductor wafer. Great expense is invested in building clean rooms which have superior ventilation and therefore reduce the number of particles which may contaminate devices. However, contamination remains a problem. Accordingly, improvements which overcome any or all of the contamination problems are presently desirable.

SUMMARY OF THE INVENTION

Other objects and advantages will be obvious, and will in part appear hereinafter and will be accomplished by the present invention which provides a method and apparatus for reducing particle contamination in vacuum process equipment.

One of the major sources of particle contamination is from the process equipment. Small particles apparently reside on the chamber walls which are microscopically rough. The relatively strong burst of gases introduced into the process chamber (for example, when a vacuum chamber is being vented) will remove these particles from the walls. These contaminants may then be deposited on the processed wafer.

Rather than cleaning the chamber perfectly (which is, of course, impossible), the present invention provides a method and apparatus to introduce gases into the chamber with greatly reduced gas velocity such that the chamber wall will not be disturbed.

A processing system including a vacuum chamber and at least one tube disposed through a wall of the vacuum chamber is described herein. A gas diffuser is disposed in said tube, possibly at the end of the tube and/or outside the chamber. The gas diffuser is formed from a porous, possibly metallic, material which includes a plurality of microscopic holes whereby gas entering or leaving the vacuum chamber through the tube has a reduced force (or momentum) compared to if the gas diffuser was not present. In the preferred embodiment the porous material comprises sintered stainless steel powder. The processing system may be a semiconductor fabrication system such as a single semiconductor wafer or multi-wafer processing chamber. Alternately, the vacuum chamber may be a load lock chamber.

A method of introducing a gas to a chamber is also disclosed herein. At least one tube disposed through a wall of the chamber is provided. The tube includes a gas diffuser formed from a porous metal material disposed thereon. A gas is introduced to the chamber through the tube at a selected velocity and the velocity of the gas is decreased by flowing the gas through the gas diffuser such that gas flow is redistributed through a plurality of microscopic holes in the gas diffuser. In one embodiment, the introduction of the gas changes the pressure within the chamber, for example the pressure within the chamber is raised (i.e., the chamber is evacuated).

An advantage of the invention is that the number of unwanted particles of the wafer is greatly reduced. By minimizing the disturbance of particles on the chamber walls, the number of loose particles is reduced and therefore there is a smaller chance of contaminating the wafer.

Another advantage of the present invention is that it is simple to implement in process equipment. A gas diffuser, as described herein, may be placed in the process chamber or in one or more of the gas lines which feed the process chamber.

Also, the present invention provides flexibility for use in many applications. The diffuser which is made of compressed sintered stainless steel powder can be machined or fabricated to almost any size and shape to accommodate the unique design and space limitations of any process equipment. Thus the invention is applicable to almost all processing equipment.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. The basic theory behind the invention will be discussed first along with the preferred embodiment. Examples of applications and configurations will then be described followed by a description of modifications. Some experimental results of using the invention will then be described.

Studies have indicated that particles which reside on the surfaces of processing equipment, such as the process chamber walls, wafer handlers, inlet and outlet tubes and others, are a source of unwanted contaminants in semiconductor (or other technologies) processing. The equipment surfaces are microscopically rough and therefore tend to retain particles. The relatively strong burst due to gas introduction into the process chamber may remove particles from the walls. These unwanted contaminants may later be deposited on the wafer.

Since it is impossible to perfectly clean the chamber, the apparatus and method of the present invention attempts to introduce gases into the chamber with minimum gas velocity such that particles which remain on the chamber wall will not be disturbed. The diffusers of the present invention are made to meet this requirement by delivery gases softly through a material which has many microscopically small holes. Because of the enormous surface area of the diffuser, the gas flow in the gas line will be redistributed through the filter holes such that the diffused gas velocity will be reduced dramatically even though the same amount of gases are flown through. Hence, much smaller forces are experienced on the chamber walls due to the smaller gas velocity and therefore less particles will be disturbed to contaminate wafers.

In an equation, this can be stated as:

$$F = \frac{dP}{dt} = \frac{d(F'/A)}{dt}$$

where F is the total force carried by the evacuated gas, P is the gas pressure exerted from the line, t is the ventilation time, and F'/A is the force per unit of surface area. (It is noted that this discussion is not mathematically rigorous but rather included herein solely for illustrative purposes.)

From the equation, it can be seen that one way to lower the total force (F) that is carried by the gas into the vacuum chamber is to increase the amount of time it takes to lower the total force (i.e., increase dt). Prior art methods have used this technique by including valves or other apparatus to increase the venting or pumping times. This method, however, increases costs due to increased fabrication time and still does not lower the total force as much as would be desired.

The present invention is based on lowering the pressure rather than increasing the time. As noted in the last portion of the equation, the pressure may be thought of as some force per area. Therefore, if the surface area which the gas travels through is increased, the pressure will decrease and therefore the total force will decrease.

Figure 1:
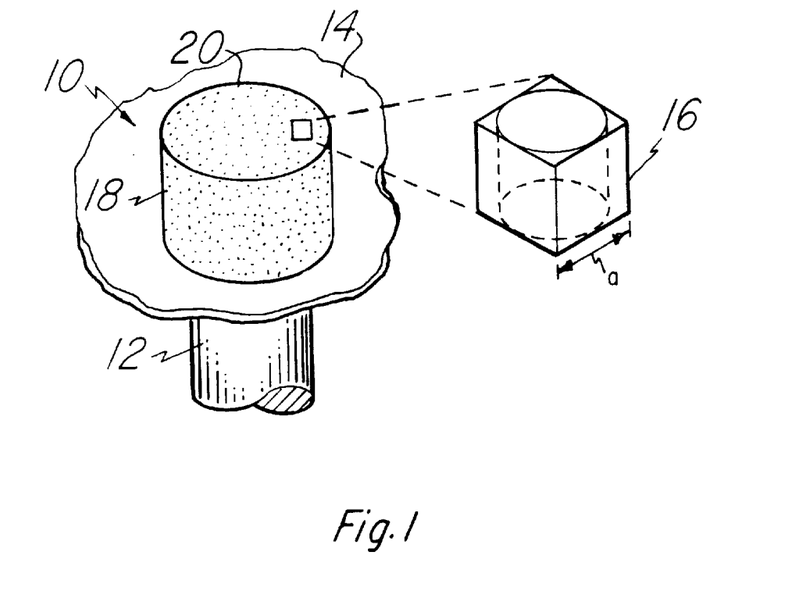
FIG. 1 is a first embodiment end-of-line gas diffuser.

An example of a diffuser 10 of the present invention is illustrated in FIG. 1. The diffuser 10 is fixed on the end of inlet or outlet tube 12. The tube 12 is disposed through chamber wall 14. The tube 12 provides a conduit for gases traveling into or out of the process chamber.

In the illustrated example, the gas diffuser 10 is cylindrical; however, the shape is not critical.

The diffuser 10 is formed from a porous material which includes many microscopic holes. This is illustrated in the FIG. 1 by the blow up of a single hole 16. As illustrated, the diameter of the single hole is and which may be on the order of about 0.05 to 200 μm with a presently preferred pore size of about 2 μm. Although for illustrative purposes, the hole 16 is drawn as a cylinder, in reality the path which gases travel through the diffuser will not likely be a straight line. In other words, the diffuser 10 may be formed from a porous amorphous material.

Most porous materials may be used to achieve the goal of minimized gas velocity. The preferred embodiment material is sintered stainless steel powder. This material may be used in a heated environment up to about 900° C.

Other materials may also be used. For example, stainless steel membranes can be used in heated environments of about 450° C. Hastelloy C-22 alloy may be used in chambers which have corrosive gases. Teflon membranes may be used in conditions which may have corrosive gases and in cold (e.g., <50° C.) environments.

It should be noted when choosing a material, other factors must be considered. For example, the temperature requirements must be taken into consideration. Also, the diffuser must withstand the processing chemicals and must not adversely outgas or create other undesirable contaminants.

The metallic diffusers are the presently preferred embodiment. These diffusers have at least three advantages over plastic or teflon. First, the metallic diffusers are capable of reaching much higher temperatures than the teflon or plastic. Second, the metallic diffusers provide flexible geometries and can therefore be fabricated to fit in a wide variety of configurations. The diffusers can be machined to fit most applications. Third, the metal diffusers do not outgas and this is an important feature in many manufacturing environments.

The diffuser of FIG. 1 comprises a hollow cavity which is fastened to the inlet or outlet tube 12. The cavity is fully enclosed (except for the microscopic pores). Both the side surfaces 18 and the top surface 20 may be formed from the porous material. Alternatively, only a portion of the surface can be of the porous material and the remainder of another material. In one example, the side surface 18 is formed from sintered stainless steel powder and the top surface 20 is formed from stainless steel.

Figure 2A:
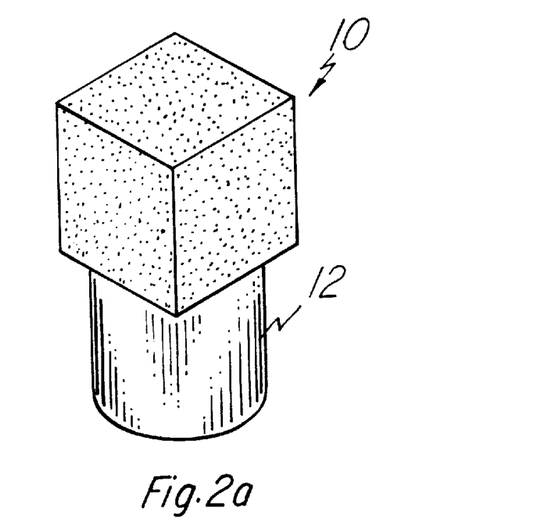
FIGS. 2a and 2b illustrate alternate configurations of the end-of-line diffuser.
Figure 2B:
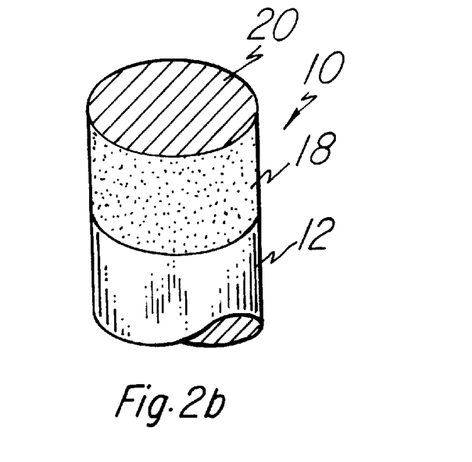

FIGS. 2a and 2b illustrate two of the many other possible configurations. In 2a, a rectangular (or square) diffuser 10 is attached to gas tube 12. In FIG. 2b, a cylindrical diffuser 10 of substantially the same diameter of tube 12 is used. The diffuser 10 of FIG. 2b is formed from different materials on the top surface 20 and the side surface 18.

The diffusers illustrated in FIGS. 1 and 2 are all end-of-line diffusers. That is, they are affixed to the end of the gas tube 12 and therefore may extend into the chamber. In some applications, there is no room in the chamber for the gas diffuser. In this case, an in-line diffuser may be preferred.

Figure 3A:
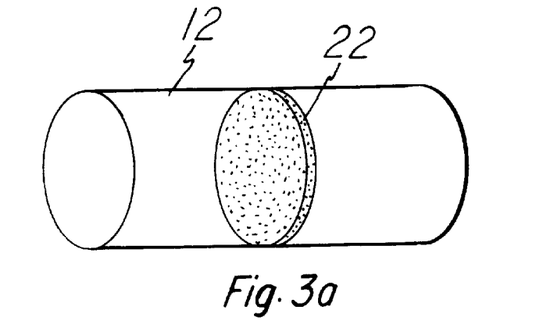
FIGS. 3a and 3b illustrate in-line diffusers.

An in-line diffuser 22 is illustrated in FIG. 3a. The diffuser 22 is a cylindrical disk composed of a porous material as described above. In this example, the diffuser 22 is disposed in gas tube 12 and has the same circumferential shape as the tube 12. The gas diffuser 22 may be flat (as illustrated) or take on other shapes (not shown).

Figure 3B:
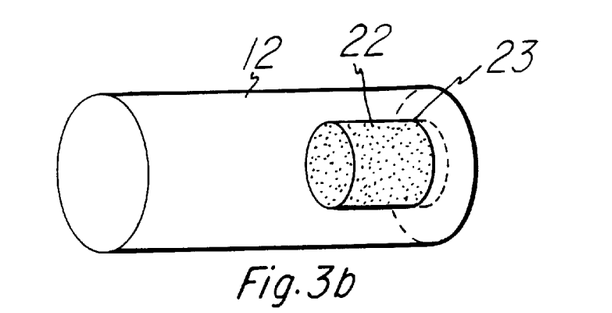

Another example of an in-line diffuser 22 is illustrated in FIG. 3b. In this example, the diffuser 22 is mounted at the end of tube 12. The diffuser 22 is sealed onto the tube 22 at perimeter 23. The seal may be an o-ring or may be welded.

Figure 4:
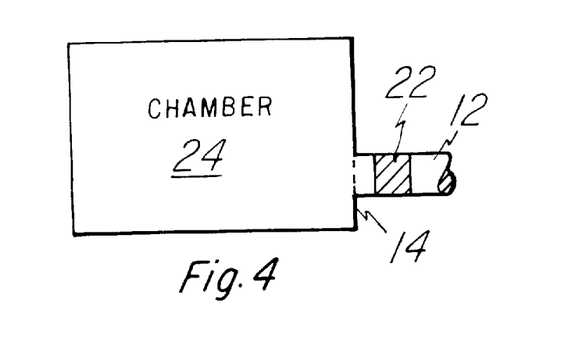
FIGS. 4–6 schematically illustrate process chamber implementations of the diffuser of the present invention.
Figure 5:
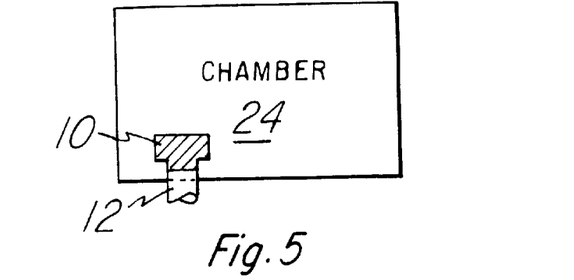
Figure 6:
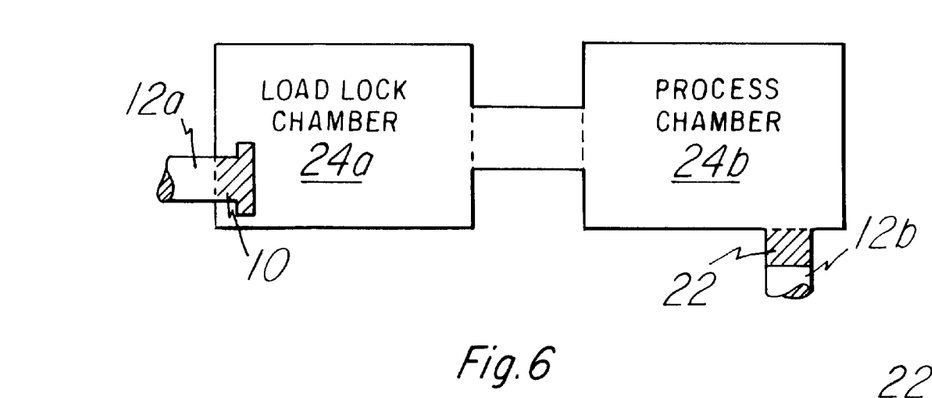

Several configuration examples are illustrated in FIGS. 4–6. FIG. 4 illustrates an in-line diffuser 22. The diffuser 22 is disposed in gas inlet/outlet tube 12 which leads into the chamber 24 through chamber wall 14. The chamber 24 may in general be any process chamber. For example, the chamber 24 may be a multiwafer processing furnace, a single-wafer process chamber, a load-lock chamber or in general any vacuum chamber. It is noted that a true chamber would include many other features including possibly numerous tubes leading into and/or out of the chamber. Only one tube has been illustrated herein for the purpose of keeping the examples simple. One, all or only some of the tubes may have a gas diffuser (either in-line, end-of-line or both) included.

An example of a chamber 24 with an end-of-line diffuser 10 is illustrated in FIG. 5. Once again, the chamber may be a single or multi-wafer processing furnace or, in general, any vacuum chamber.

FIG. 6 illustrates a configuration which includes both a load lock chamber 24a and a process chamber 24b. Gas tubes 12a and 12b are also illustrated in FIG. 6. This situation is common in single wafer processing systems where one wafer is processed in the chamber 24b at a time which other wafers await processing in chamber 24a. Both chambers can be held at vacuum pressures.

Figure 7:
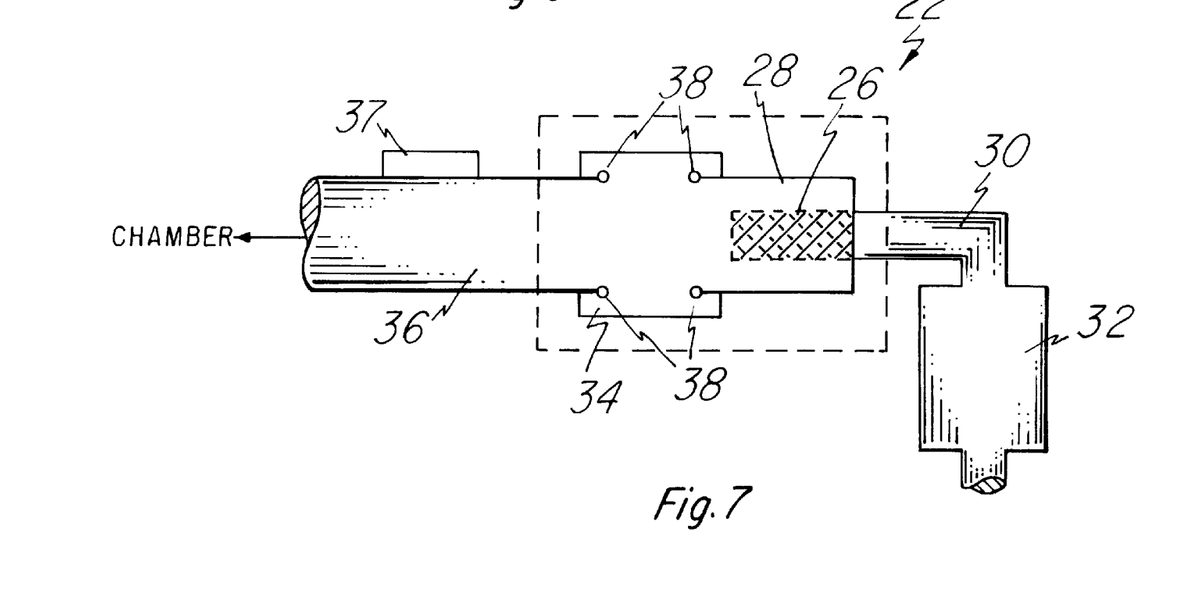
FIGS. 7 and 8 illustrate in-line gas diffuser configurations.

An example of an in-line diffuser 22 is illustrated in FIG. 7. The diffuser 22 comprises a membrane filter 26 which is formed within a stainless steel tube 28. The membrane filter 26 is disposed on the end of gas tube 30. An in-line gas filter 32 is also illustrated in FIG. 7.

On the other end of stainless steel tube 28 is an adapter 34 which leads to quartz tube 36. The adaptor may be sealed with o-rings 38 as shown here. The quartz tube 36 leads to a microwave tube illustrated by microwave source 37. The quartz tube 36 leads to the processing chamber.

The in-line diffuser 22 illustrated in FIG. 7 is designed to connect with the microwave tube so that there is no restriction of flow. The gas velocity will be reduced dramatically by having gas flow through the many microscopically small holes the diffuser has compared to the standard tube which is typically used.

In a microwave system it is preferable that the diffuser not be placed between the microwave source and the process chamber. This choice of location is to avoid a situation where the radicals generated are neutralized by the enormous surface area the diffuser has. In other words, even if the diffuser does help reduce particles, it may also destroy the microwave generated chemical species used for wafer processing.

Figure 8:
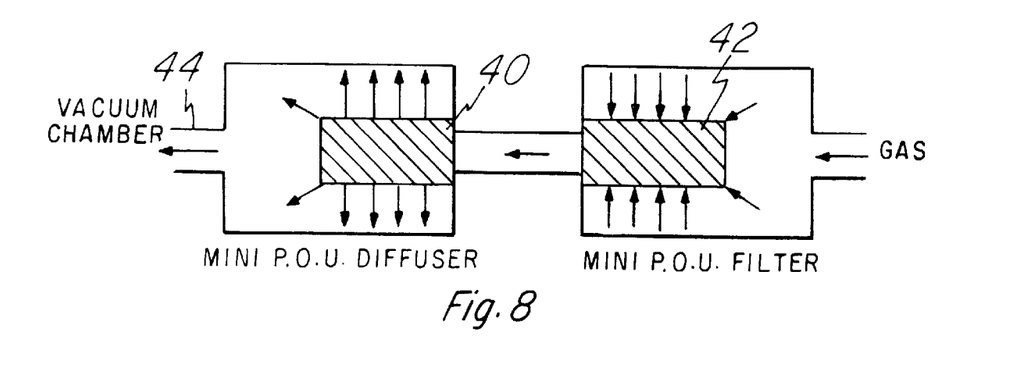

Another in-line diffuser configuration is illustrated in FIG. 8. The configuration here can be utilized without significant modification to most processing equipment. A point of use filter 42 is provided to filter contamination from the gases. A point of use diffuser 40 is coupled to the filter 42 to provide the gas diffusion. It is noted that the diffuser 40 may comprise a filter 42 coupled backwards. This embodiment, however, is not preferred since much of the gain in gas force may be lost when the gas begins to flow in smaller diameter tube 44. The configuration would work considerably better if the diameter of tube 44 was on the order of the diameter of diffuser 40 but in most typical processing systems this would require a modification of the processing equipment.

The gas diffusers described herein have been experimentally tested. In one experiment, a cartridge was used as a diffuser to difuse nitrogen gas into a vacuum chamber to raise the chamber pressure to atmospheric pressure. This filter cartridge was made of Integral Durapore™ (hydrophobic polyrinylidene difluoride membrane) with a poly salfore support structure. This filter can be used, for example, in an inert gas system.

The experimental system was implemented the load lock of a dry-etch single-wafer advanced vacuum processor (AVP) system. Without the diffuser, fast venting generated an average of 613 particles/wafer of greater than 0.15 $\mu$m with the diffuser, however, only an average of 7.2 particles/wafer were generated by the pump/vent cycle. In this experiment, the diffuser was configured in a manner similar to that shown in FIG. 5. This result, i.e., a 98.8% reduction in particles, demonstrates one of the significant features of the present invention.

Figure 9:
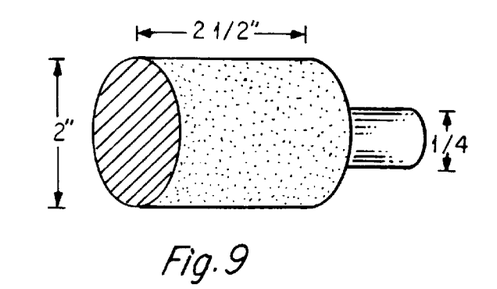
FIG. 9 illustrates an end-of-line gas diffuser which was experimentally tested.
Figure 10:
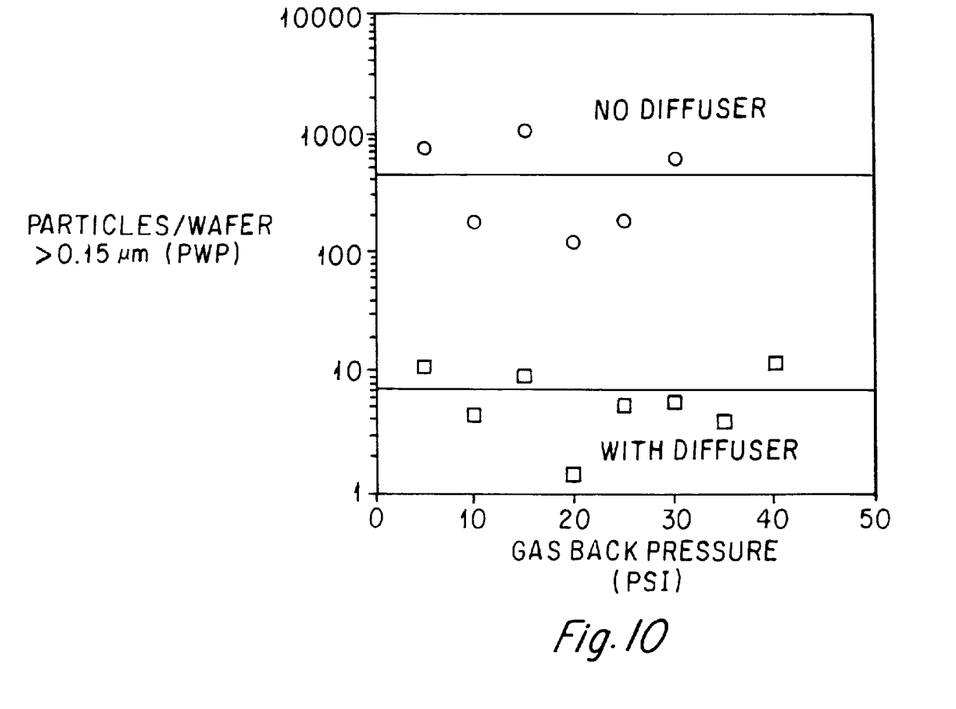
FIG. 10 is a graphical representation of the number of particles per wafer as a function of the gas line pressure with a diffuser and with no diffuser.

Another experiment was performed to test a porous metal diffuser, such as the one illustrated in FIG. 9. The diffuser was coupled to a quarter-inch VCO fitting and was installed in the load lock of an advanced vacuum processor. The level of particle contamination on the test wafers after chamber venting at different line pressure is presented graphically in FIG. 10. It should be noted that the particles per wafer are plotted on a logarithmic scale in FIG. 10. On average, about 99.1% of particle contamination was eliminated by the used of the present invention.

Other membrane materials and support structures can also be used. It should be noted that outgassing may present a potential problem (except with the metal diffusers) and should therefore be considered.

Figure 11:
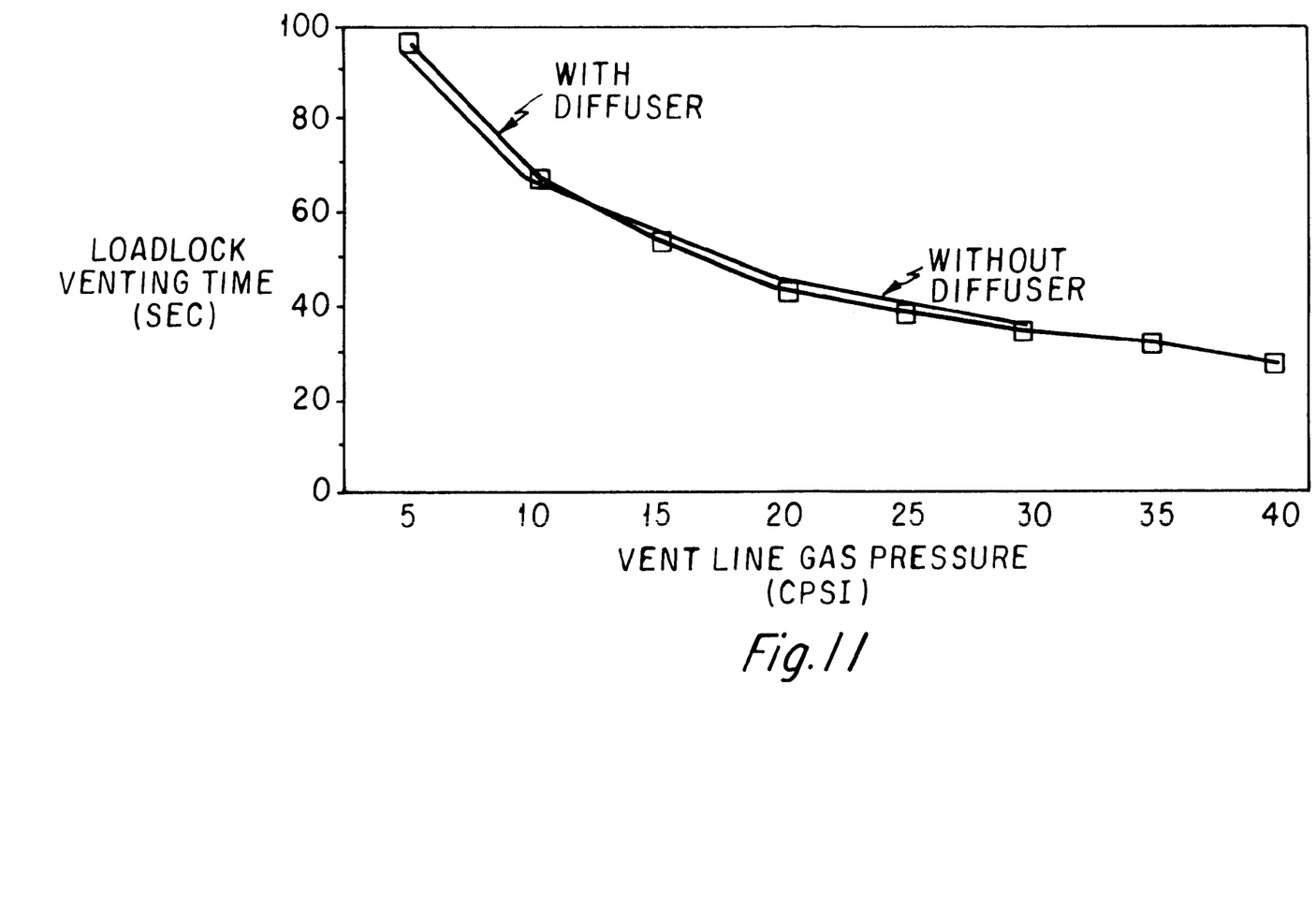
FIG. 11 is a graphical representation of the venting time as a function of the gas line pressure with a diffuser and with no diffuser.

Referring now to FIG. 11, a graph of the load/lock venting time as a function of vent line gas pressure is presented. As illustrated, the diffuser does not create any appreciable difference in venting time. This is a significant advantage over valve systems which delay the venting times.

It has been demonstrated that a diffuser will reduce particle contamination. In the process chambers due to the soft release of process gas which will not disturb the chamber and stir any particles inside the chamber which could contaminate wafers. An experimental test result has shown that by installing the diffuser on the top of the microwave tube, only 13 particles (>0.15 $\mu$m) were added to a 6 inch wafer compared with the hundred of particles that were added without a diffuser. In a microwave system, however, this end-of-line gas diffuser may only be able to be used in the load lock to vent gas. As previously discussed, the diffuser may not be able to be used at the end of the microwave tube where the radicals generated are neutralized by the enormous surface area the diffuser has. Even though it does serve the purpose of reducing particles, the end-of-line diffuser also may destroy the microwave generated chemical species for wafer processing. This end-of-line diffuser may not be a practical solution for soft process gas delivery in a microwave system.

Therefore, an in-line diffuser has to be designed for softly delivering gases upstream of the microwave cavity in line with the gas line. An example diffuser was described with reference to FIG. 7. This in-line diffuser will help to eliminate pressure surge during gas introduction to the vacuum process chamber and it will not neutralize radicals generated by microwave since the diffuser is installed upstream of the cavity.

In summary, the present invention uses the idea of reducing the velocity of gas flow into the process chamber using a diffuser as the key factor to reduce particle contamination in the semiconductor process equipment. With this basic idea, both end-of-line and in-line diffusers can be designed and fabricated using commercially available membrane filter materials or other materials such as porous metallic materials.

The present invention also uses the idea of a diffuser for introducing process gases into the vacuum chamber without contaminating wafers. Both the in-line and end-of-line diffusers have been proved effective in reducing particle contamination in the semiconductor process equipment. With the combination of both in-line and end-of-line diffuser, experiments have shown a reduction in particle contamination from greater than 1000 particles/wafer down to less than 30 particles/wafer or better.

Although described herein with specific reference to semiconductor (e.g. silicon, germanium, gallium arsenide, mercury cadmium telluride, barium strontium titanate or others), the present invention may be applied to other technologies. In general, any industry which is concerned with particle contamination in a chamber with gas flow may benefit from the use of the present invention.

This invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A processing system comprising:
    a vacuum chamber;
    at least one inlet tube disposed through a wall of said vacuum chamber;
    at least one outlet tube disposed through a wall of said vacuum chamber; and
    a gas diffuser disposed in said outlet tube, said gas diffuser comprising a material which includes a plurality of microscopic holes whereby gas leaving said vacuum chamber through said outlet tube has a reduced force.

2. The system of claim 1 wherein said gas diffuser is disposed at an end of said outlet tube within said vacuum chamber.

3. The system of claim 2 wherein said gas diffuser has a circumference substantially the same as a circumference of said outlet tube.

4. The system of claim 1 wherein said gas diffuser is disposed within said outlet tube outside said vacuum chamber.

5. The system of claim 1 wherein said porous metallic material comprises sintered stainless steel powder.

6. The system of claim 1 wherein said processing system comprises a semiconductor fabrication system.

7. The system of claim 6 wherein said vacuum chamber comprises a single semiconductor wafer processing chamber.

8. The system of claim 1 wherein said vacuum chamber comprises a load lock chamber.

9. The system of claim 1 and further comprising:
    a second tube disposed through a wall of said vacuum chamber; and
    a second gas diffuser disposed in said second tube, said second gas diffuser comprising a porous metallic material.

10. The system of claim 1 and further comprising an inlet gas diffuser disposed in said inlet tube.

11. The system of claim 10 wherein said second gas diffuser is disposed at an end of said inlet tube within said vacuum chamber.

12. The system of claim 10 wherein said second gas diffuser is disposed within said inlet tube outside said vacuum chamber.

13. The system of claim 12 and further comprising a microwave cavity for generating radicals within a gas to be introduced in said chamber wherein said microwave cavity is disposed between said second gas diffuser and said chamber.

14. The system of claim 1 wherein said gas diffuser comprises a porous Teflon material.

15. A method of introducing a gas to a chamber, comprising the steps of:
    providing at least one tube disposed through a wall of said chamber, said tube including a gas diffuser formed from a porous material disposed thereon, said gas diffuser having a circumferential radius less than or equal to the radius of said tube, said gas diffuser disposed outside said vacuum chamber;
    introducing a gas at a selected velocity to said chamber through said tube; and
    slowing the velocity of said gas by flowing said through said gas diffuser such that gas flow is redistributed through a plurality of microscopic holes in said gas diffuser.

16. The method of claim 15 and further comprising the step of generating radicals within said gas subsequent to said step of slowing the velocity of said gas but prior to said step of introducing said gas to said chamber.

17. A method of changing the gas pressure within a chamber, comprising the steps of:
    providing at least one tube disposed through a wall of said chamber, said tube including a gas diffuser formed from a porous material disposed thereon, said gas diffuser disposed within said tube outside said chamber;
    maintaining said chamber at a selected pressure;
    introducing a gas at a selected velocity into said tube; and
    flowing said gas through said diffuser such that said gas flows through a plurality of microscopic holes in said diffuser and into said chamber thereby substantially changing the pressure within said chamber whereby said gas enters at a reduced force thereby disturbing a limited number of particle contaminants.

18. A processing system comprising:
    a chamber;
    at least one tube disposed through a wall of said chamber;
    a gas diffuser disposed within said tube and outside said chamber, said gas diffuser comprising a material which includes a plurality of microscopic holes whereby gas entering or leaving said chamber through said tube has a reduced force.

19. The system of claim 18 and further comprising a microwave cavity for generating radicals within a gas to be introduced in said chamber through said tube wherein said microwave cavity is disposed between said gas diffuser and said chamber.

* * * * *